(12) United States Patent
Tseng

(10) Patent No.: US 6,391,711 B1
(45) Date of Patent: May 21, 2002

(54) METHOD OF FORMING ELECTRICAL CONNECTION BETWEEN STACK CAPACITOR AND NODE LOCATION OF SUBSTRATE

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/677,810

(22) Filed: Oct. 3, 2000

(51) Int. Cl.⁷ .............................................. H01L 21/44
(52) U.S. Cl. ...................... 438/253; 438/386; 438/256; 438/396; 438/399; 438/666; 438/672; 438/675; 438/629; 438/620; 257/303; 257/306
(58) Field of Search ................................. 438/253, 256, 438/259, 396, 399, 666, 672, 675, 629, 620; 257/306, 303

(56) References Cited

U.S. PATENT DOCUMENTS

| | | | | |
|---|---|---|---|---|
| 5,827,766 A | * | 10/1998 | Lou | 438/253 |
| 6,083,831 A | | 7/2000 | Dennison | |
| 6,093,601 A | * | 7/2000 | Tsai et al. | 438/253 |
| 6,140,179 A | * | 10/2000 | Chen et al. | 438/254 |
| 6,140,201 A | * | 10/2000 | Jenq et al. | 438/396 |
| 6,184,152 B1 | * | 2/2001 | Lin | 438/753 |
| 6,207,584 B1 | * | 3/2001 | Shen et al. | 438/762 |
| 6,262,450 B1 | * | 7/2001 | Kotecki et al. | 257/306 |
| 6,294,436 B1 | * | 9/2001 | Park et al. | 438/396 |
| 6,323,084 B1 | * | 11/2001 | Hyun et al. | 438/255 |

OTHER PUBLICATIONS

Kaga et al., Crown-shaped Stacked-Capacitor Cell for 1.5-V Operation 64-Mb DRAM's, IEEE Trans. Electron Devices, vol. 38, No. 2, Feb. 1991.*

* cited by examiner

Primary Examiner—Matthew Smith
Assistant Examiner—Belur V Keshavan
(74) Attorney, Agent, or Firm—Klarquist Sparkman LLP

(57) ABSTRACT

The present invention relates to a method of forming a contact pedestal for an electrical connection between a stack capacitor and a node location of a substrate. The present invention is characterized by forming, just based on patterning a mask layer twice, a hole in the shape of a stud in the dielectric material deposited over the node location, to make a contact pedestal in the shape of a stud for an electrical connection between a node location of a FET in a substrate, and a stack capacitor spaced from the substrate by the dielectric material.

20 Claims, 8 Drawing Sheets

METHOD OF FORMING ELECTRICAL CONNECTION BETWEEN STACK CAPACITOR AND NODE LOCATION OF SUBSTRATE

FIELD OF THE INVENTION

The present invention relates to a method of forming an electrical connection between a stack capacitor and a node location of a substrate, particularly to a method of forming a contact pedestal for an electrical connection between a stack capacitor and a node location of a substrate.

BACKGROUND OF THE INVENTION

With the memory cell density of DRAMs being continuously upgraded, a challenge to maintain sufficiently high storage capacitance subject to decreasing cell area is inevitably faced by related industries, i.e., the enhancement of storage capacitance per unit of cell area has been widely anticipated, and plenty of effort has been made to achieve it through cell structure techniques. Among such techniques are methods for forming a non-buried bit line construction (or referred to as "capacitor-under-bit-line") where a stack capacitor is electrically connected to a cell FET through a contact pedestal.

A prior art of forming such a non-buried bit line construction is disclosed in U.S. Pat. No. 6,083,831. The prior art, as represented by FIGS. 1~5, is characterized by a method of forming a contact pedestal including sidewall spacers 42 over which a stack capacitor is formed to electrically connect a node location 26 of a FET in a substrate 12 through the contact pedestal, wherein the method comprises the following steps: etching a contact opening 32 (in FIG. 2) into the insulating dielectric material 30 formed over the node location 26 to a degree insufficient to expose the node location 26; providing a spacer layer 40 (in FIG. 3) over the insulating layer 30 and into the contact opening 32 in a way that the thickness of the spacer layer 40 in the contact opening 32 is insufficient to fill the contact opening 32; anisotropically etching the spacer layer 40 to form a side spacer 42 (in FIG. 4) within the contact opening 32; etching through the contact opening 32 to expose the node location 26; filling the contact opening 32 with electrically conductive material (not shown in FIGS. 1~5); rendering the sidewall spacer 42 electrically conductive; and etching the electrically conductive material to form a contact pedestal including the sidewall spacer 42. The above steps which are required for the prior art are not always realistic or easily implemented under each of various circumstances. For example, the step of forming a spacer layer 40 over the insulating layer 30 and into the contact opening 32 in a way that the thickness of the spacer layer 40 in the contact opening 32 is insufficient to fill the contact opening 32, and the step of rendering the sidewall spacer 42 electrically conductive, are not always easy to implement under each of various circumstances. The present invention is thus developed to provide more alternatives for related industries to better or easily adapt relevant production processes to a variety of manufacturing conditions.

SUMMARY OF THE INVENTION

An object of the present invention is to simplify the process of forming an electrical connection between a stack capacitor and a node location of a substrate.

Another object of the present invention is to minimize the cost of forming an electrical connection between a stack capacitor and a node location of a substrate.

A further object of the present invention is to raise the stability of controlling the specification or quality of electrical connection formed between a stack capacitor and a node location of a substrate.

The present invention is characterized by providing methods of forming a contact pedestal in the shape of a stud for an electrical connection between a node location of a FET in a substrate, and a stack capacitor spaced from the substrate by dielectric material, wherein the methods provided by the present invention may feature the following steps: depositing a mask layer over the dielectric material; patterning the mask layer to obtain a first opening thereof; etching the dielectric material toward the node location through the first opening until the thickness of the dielectric material left over the node location is in a specified range including only the dimensions larger than zero, i.e., the thickness of the dielectric material left over the node location is larger than zero; patterning the mask layer to expand the first opening for forming a second opening thereof which is wider than the first opening; etching the dielectric material through the second opening to expose the node location, thereby forming a stud hole with a first end thereof at the node location, and with a second end thereof having a widest cross section relative to all the other parts of the stud hole; removing said mask layer; filling the stud hole with electrically conductive material to form a contact pedestal; and forming a stack capacitor structure which is at the second end of the stud hole and is electrically connected to the node location through the contact pedestal. Here the dielectric material may include an insulating layer over the node location, and a dielectric layer over the insulating layer; and the step of filling the stud hole with electrically conductive material may include the steps of: depositing the electrically conductive material to fill the stud hole; and removing the electrically conductive material which is outside the stud hole.

The methods provided by the present invention for forming a contact pedestal in the shape of a stud for such an electrical connection may also feature the following steps: forming dielectric material over the node location; depositing a mask layer over the dielectric material; patterning the mask layer to obtain a first opening thereof; etching the dielectric material toward the node location through the first opening until the thickness of the dielectric material left over the node location is in a specified range; expanding the first opening to obtain a second opening thereof which is wider than the first opening; etching the dielectric material through the second opening to expose the node location, thereby forming a stud hole with a first end thereof at the node location, and with a second end thereof having a widest cross section relative to all the other parts of the stud hole; depositing electrically conductive material to fill the stud hole for forming a contact pedestal; removing the mask layer and the electrically conductive material which is outside the contact pedestal; and forming a stack capacitor structure adjacent to the second end of the stud hole and is electrically connected to the node location through the contact pedestal.

The methods provided by the present invention for forming a contact pedestal in the shape of a stud for such an electrical connection may further feature the following steps: forming dielectric material over the node location; depositing a mask layer over the dielectric material; patterning the mask layer to obtain a first opening thereof; etching the dielectric material toward the node location through the first opening until the thickness of the dielectric material left over the node location is approximately equal to a specified dimension; expanding the first opening to obtain a second opening thereof which is wider than the first opening;

etching the dielectric material through the second opening to expose the node location, thereby forming a stud hole with a first end thereof contacting the node location, and with a second end thereof having a depth approximately equal to the specified dimension, and having a widest cross section relative to all the other parts of the stud hole; depositing electrically conductive material to fill the stud hole for forming a contact pedestal; removing the mask layer and the electrically conductive material which is outside the contact pedestal; and forming a stack capacitor structure adjacent to the second end of the stud hole and is electrically connected to the node location through the contact pedestal.

It can be seen that the art provided by the present invention for forming a contact pedestal for such an application is substantially different from the prior art, and is easier implemented, while capable of offering the same function as did the prior art. For example, the present invention requires no steps such as providing a spacer layer over the insulating layer and into the contact opening in a way that the thickness of the spacer layer in the contact opening is insufficient to fill the contact opening, and rendering the sidewall spacer electrically conductive. These two steps are indispensable according to the prior art and are not always easy to implement under each of various circumstances. It can thus be understood that the method provided by the present invention for forming an electrical connection between a stack capacitor and a node location of a substrate is relatively economical, reliable, and simple or systematic.

The present invention may best be understood through the following description with reference to the accompanying drawings, in which:

DETAILED DESCRIPTION OF THE PREFERRED EMBODIMENTS

Figure 1:
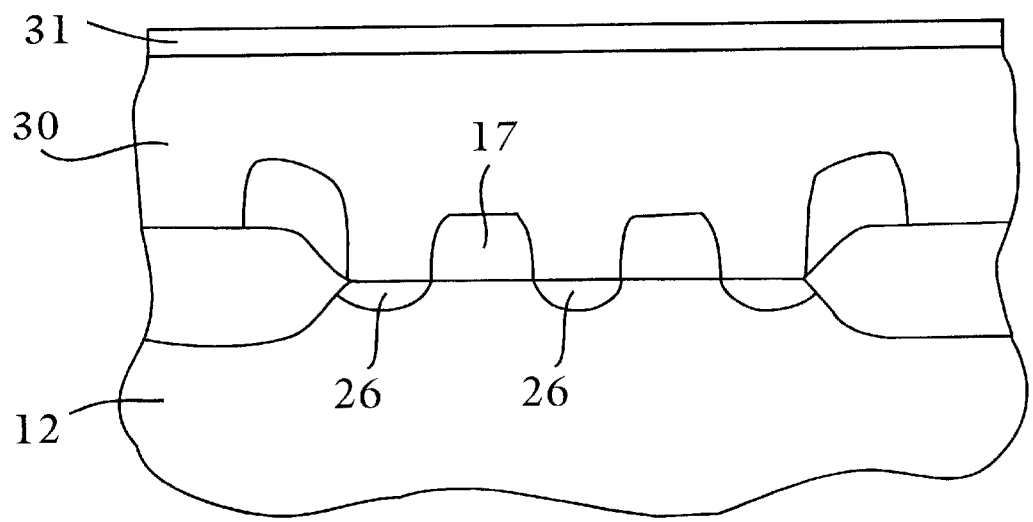
FIGS. 1~5 are diagrams representing a prior art.
Figure 2:
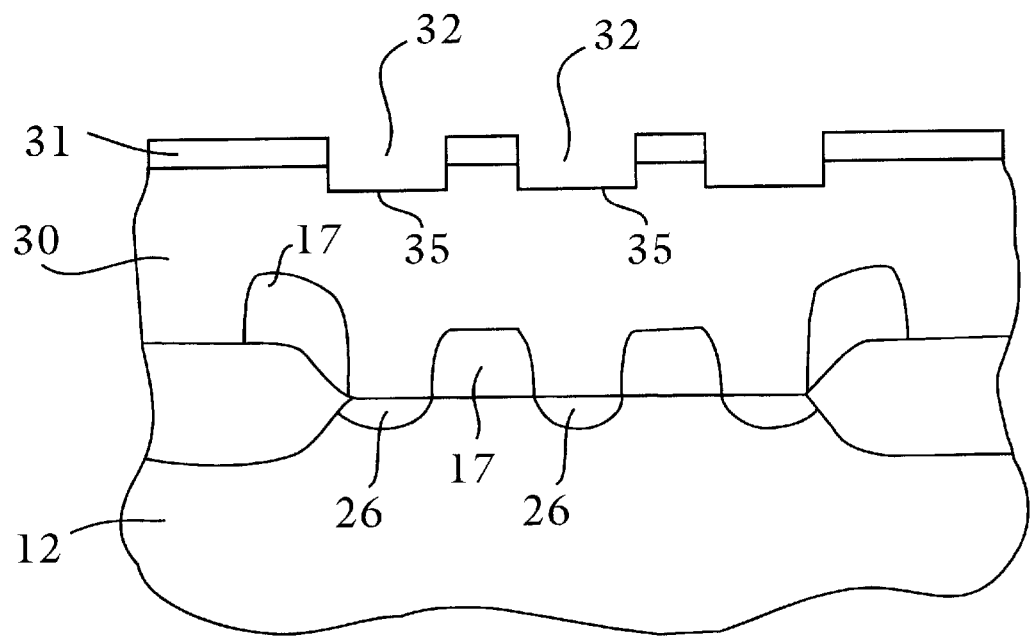
Figure 3:
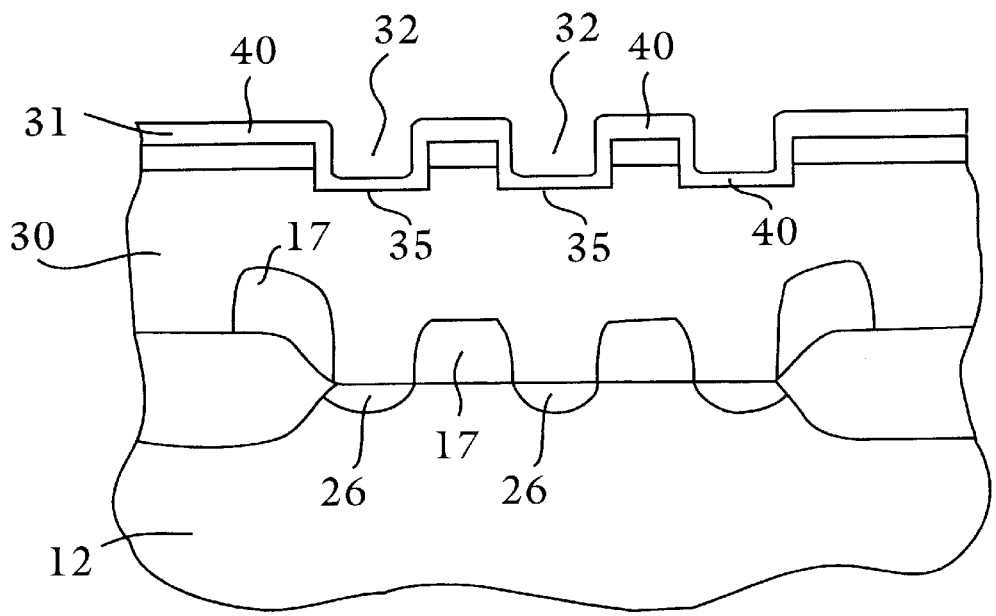
Figure 4:
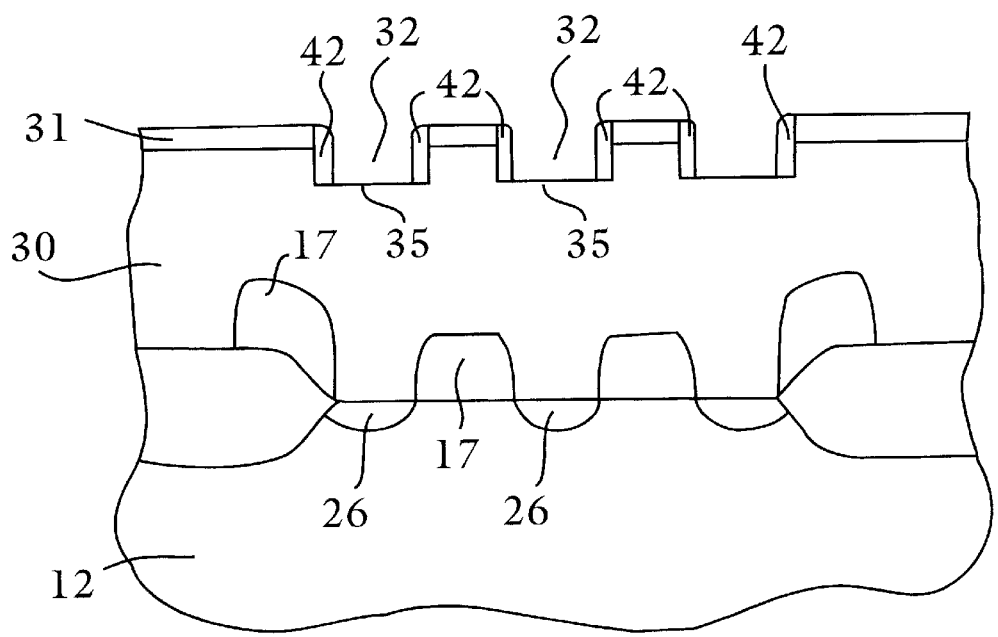
Figure 5:
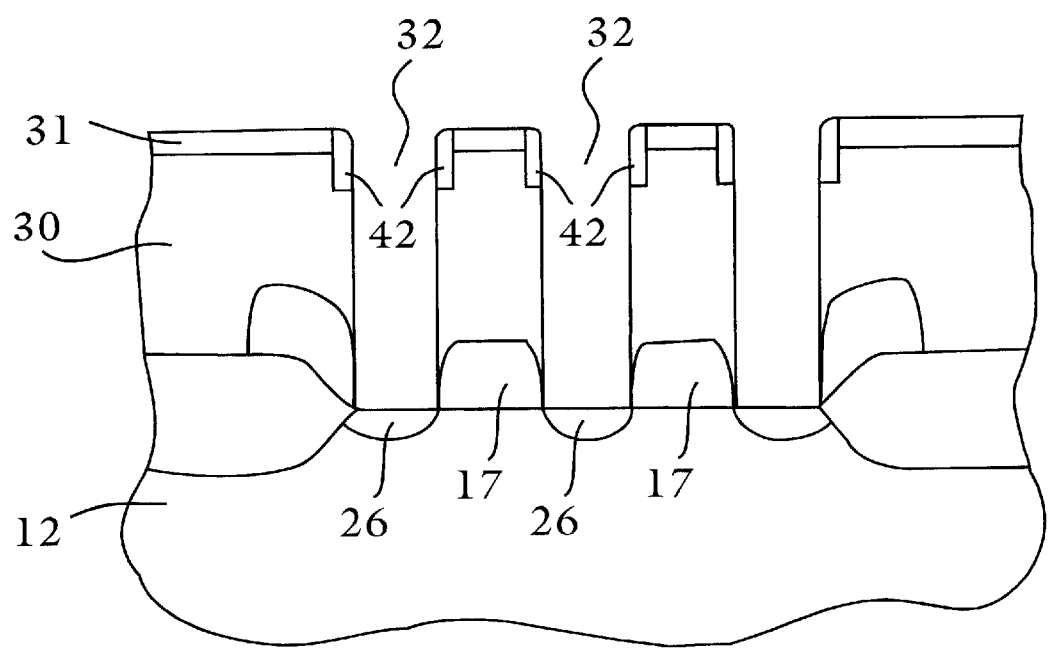
Figure 6:
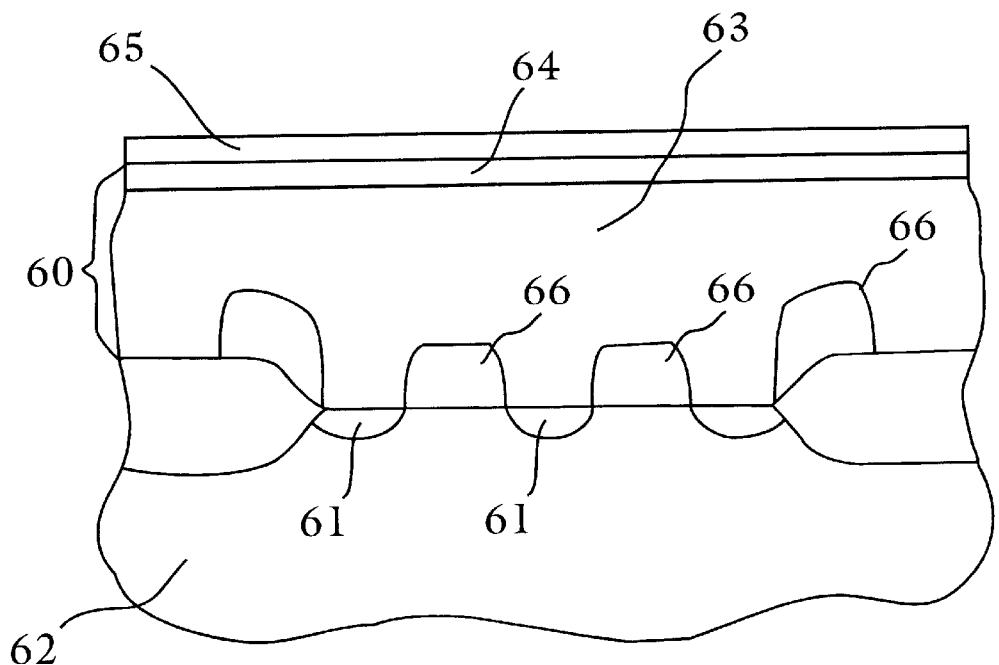
FIGS. 6~13 shows a method provided by the present invention for forming a contact pedestal as an electrical connection between a stack capacitor and a node location of a substrate.
Figure 7:
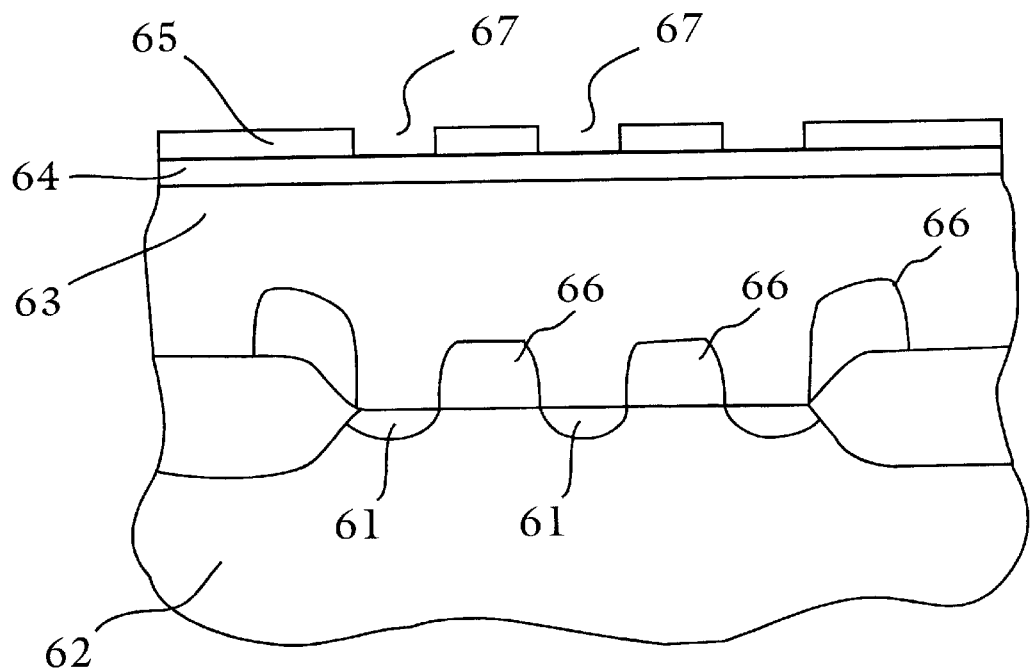
Figure 8:
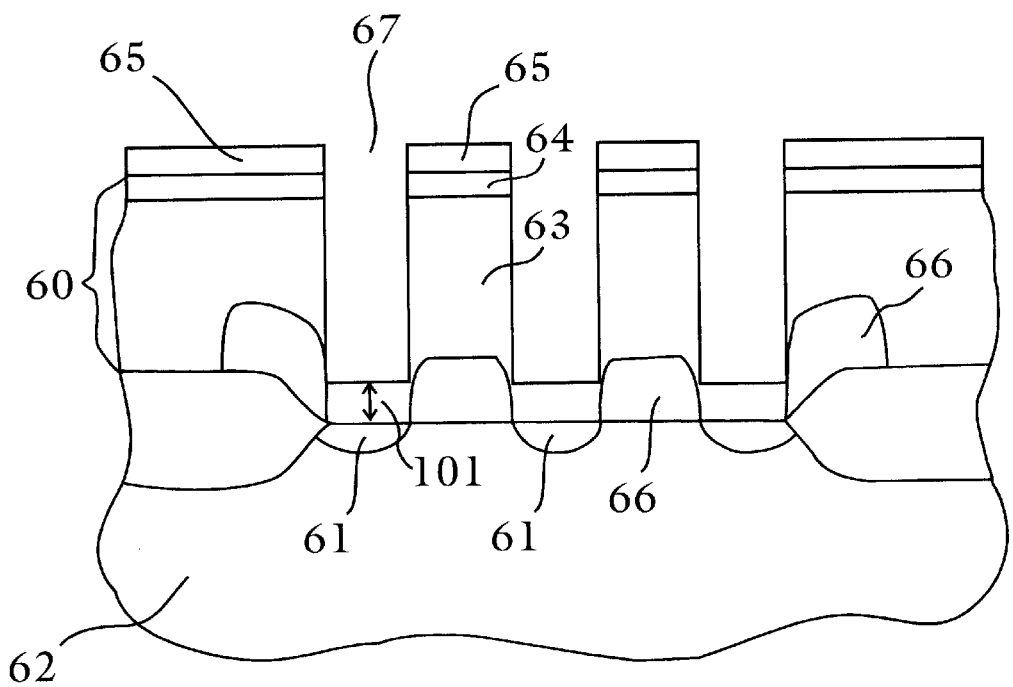
Figure 9:
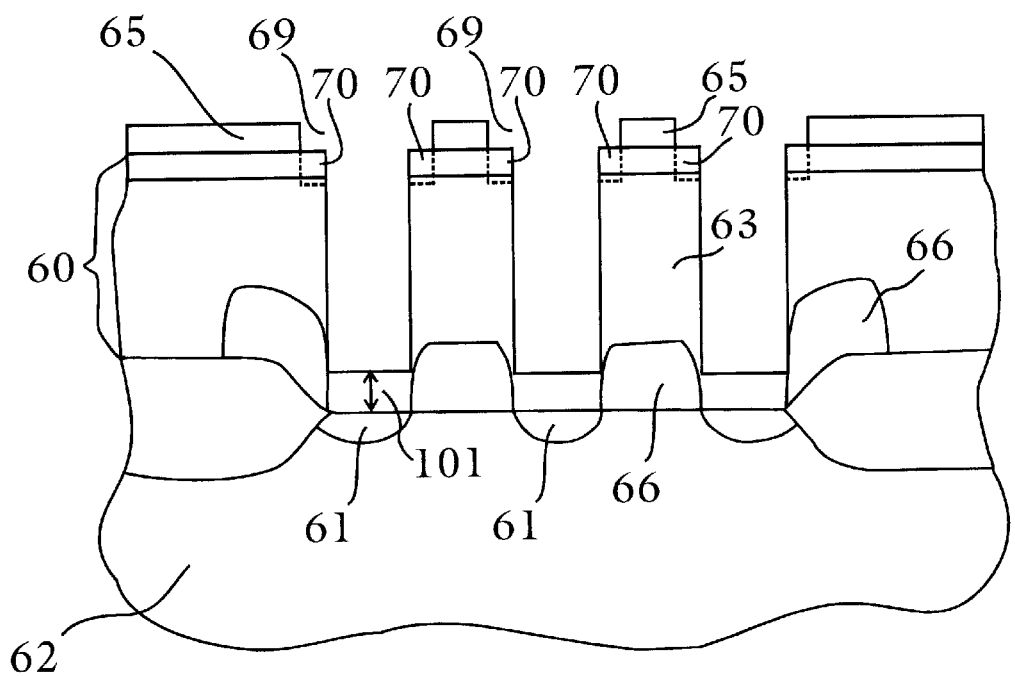
Figure 11:
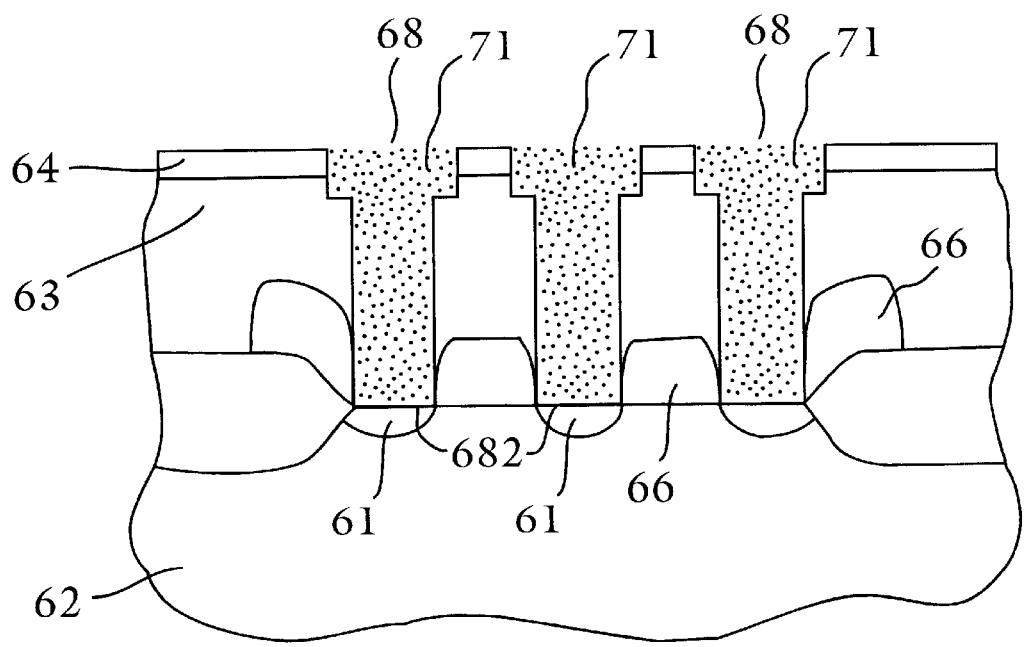
Figure 13:
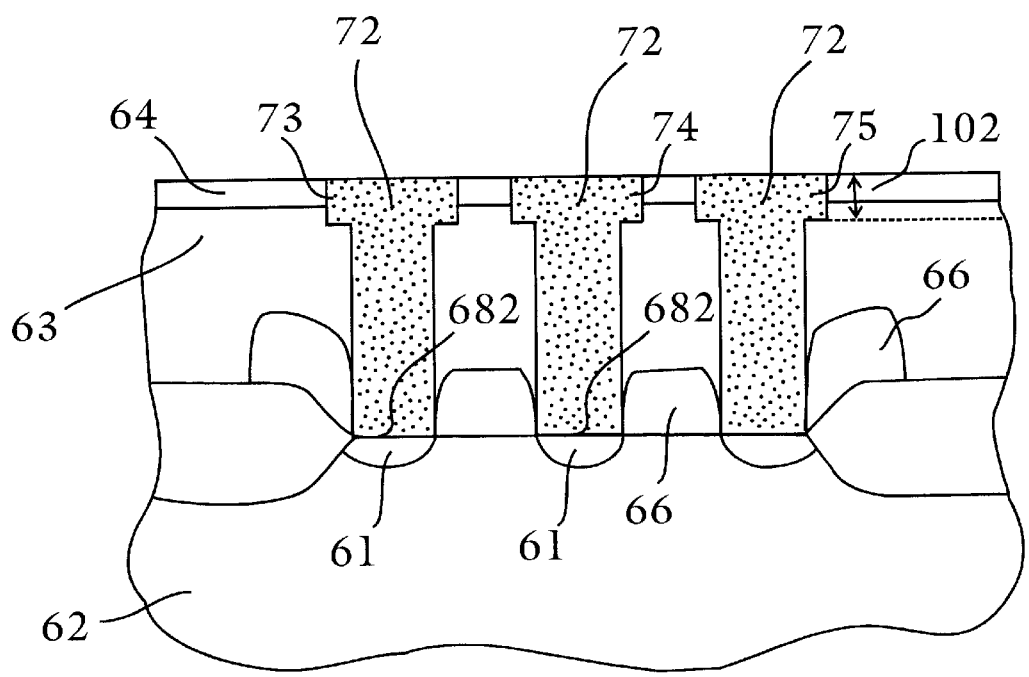

Referring to FIGS. 6~14, methods of forming an electrical connection between a stack capacitor (such as the one indicated by 77 in FIG. 14) and a node location (61 in FIGS. 6~14, which is between wordlines 66) of a substrate (62 in FIGS. 6~14) are illustrated. The method may comprise the following steps:

forming dielectric material 60 over the node location 61, as shown in FIG. 6;

depositing a mask layer 65 over the dielectric material 60, as shown in FIG. 6;

patterning the mask layer 65 to obtain a first opening 67 thereof, as shown in FIG. 7;

etching the dielectric material 60 toward the node location 61 through the first opening 67 until the thickness (101 in FIG. 8) of the dielectric material 60 left over the node location 61 is in a specified range or approximately meets a specified dimension, as shown in FIGS. 8;

patterning the mask layer 65 to expand the first opening 67 for forming a second opening 69 thereof which is wider than the first opening 67, as shown in FIG. 9;

etching the dielectric material 60 through the second opening 69 to expose the node location 61, thereby removing the part 70 (shown in FIG. 9) of dielectric material 60 and forming a stud hole 68 (in FIG. 10) with a first end 682 thereof at or contact the node location 61, and with a second end 683 thereof having a widest cross section relative to all the other parts of the stud hole 68;

removing the mask layer 65;

filling the stud hole 68 with electrically conductive material 71 (shown in FIG. 11) to form a contact pedestal 72 (as shown in FIG. 13) having a second end 73 or 74 or 75 (in FIG. 13) and a first end 682 at or contact the node location 61; and forming a stack capacitor structure 77 (in FIG. 14) which is at (or contact or adjacent to) the second end 683 of the stud hole 68 in FIG. 11 (i.e., the stack capacitor structure is formed at or contact or adjacent to the second end 73 or 74 of the contact pedestal 72 shown in FIG. 13) and is electrically connected to the node location 61 through the contact pedestal 72.

As shown in FIG. 6, the dielectric material 60 may include an insulating layer 63 and a dielectric layer 64, with the insulating layer 63 being between the node location 61 and the dielectric layer 64.

Figure 12:
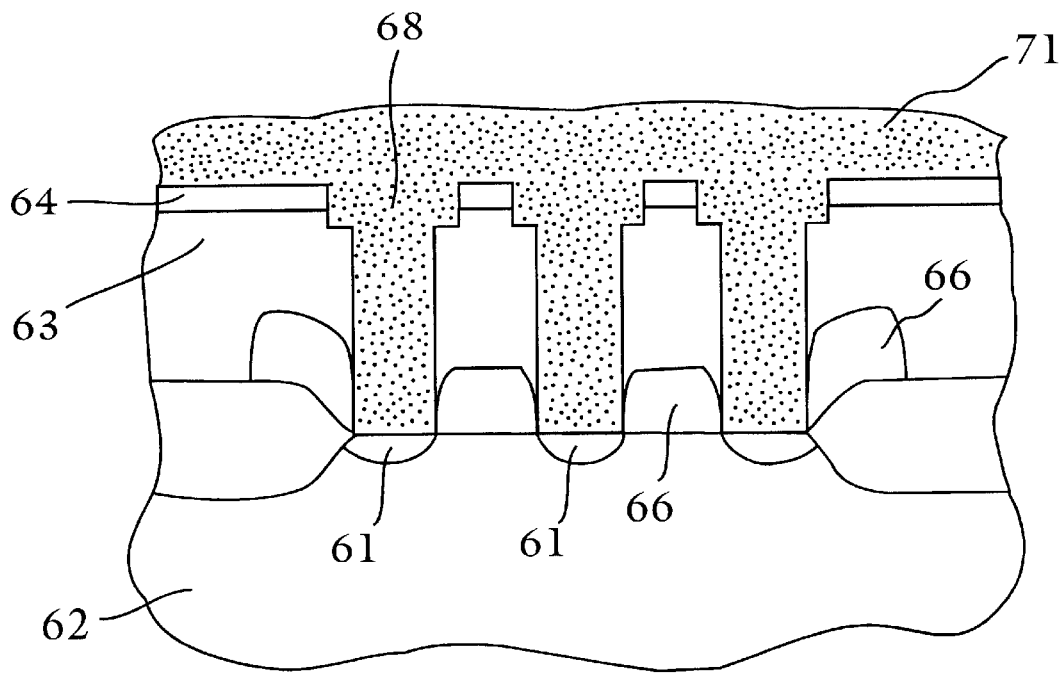

The step of filling the stud hole 68 of FIG. 11 with electrically conductive material 71 may include the steps of: depositing the electrically conductive material 71 to fill the stud hole 68 as shown in FIG. 12; and removing the electrically conductive material which is outside the stud hole 68.

The first opening 67 is at a location corresponding to the node location 61. For example, the first opening 67 may be right above the node location 61 or at any point in the exposed surface of the dielectric material 60, as long as the dielectric material 60 can be etched through the first opening 67 toward the node location which is to connect a capacitor to be formed above the dielectric material 60. The step of etching the dielectric material 60 may be a directional etching. The specified range includes only thickness dimensions which are larger than zero, i.e., the thickness 101 (in FIG. 8 or 9) of the dielectric material 60 left over the node location 61 after etching the dielectric material 60 toward the node location 61 through the first opening 67 is larger than zero. Second opening 69 as shown in FIG. 9 may be formed by laterally expanding the first opening 67, or by removing part of the mask layer 65, such as removing the part of mask layer 65 around the first opening 67.

Figure 14:
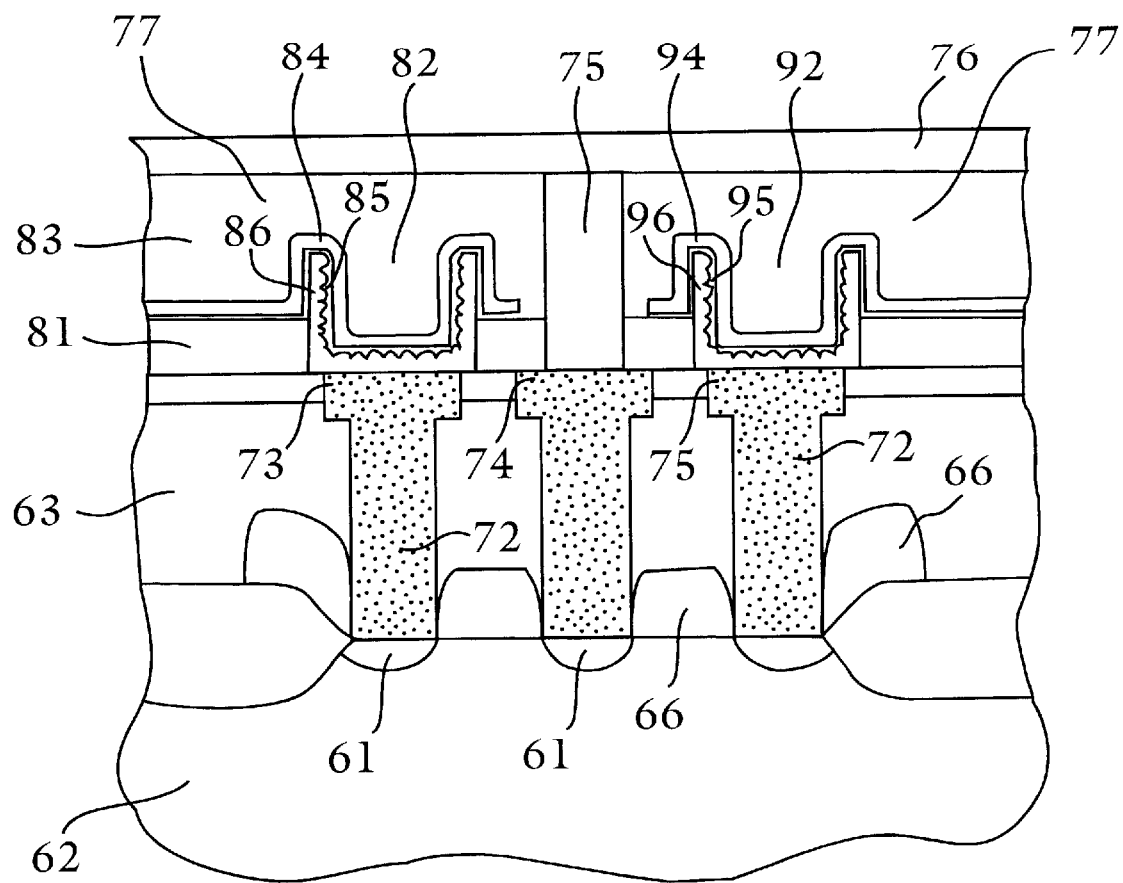
FIG. 14 is for depicting a process of forming a capacitor structure over the contact pedestal formed according to the present invention.

The step of forming the capacitor structure 77 in FIG. 14 may include the steps of: forming a first capacitor layer 86 electrically connected with the contact pedestal 72 (specifically speaking, the second end 73 or 75 of the contact pedestal); and forming a second capacitor layer 85 adjacent to the first capacitor layer 86, and a third capacitor layer 84 adjacent to the second capacitor layer 85.

Another aspect of the step of forming the capacitor structure 77 may include the steps of: forming a first capacitor layer 86 electrically connected with the contact pedestal 72; forming a second capacitor layer adjacent to the first capacitor layer; and forming a third capacitor layer spaced from the first capacitor layer by the second capacitor layer.

A further aspect of the step of forming the capacitor structure may include the steps of: forming a capacitor container opening 82 or 92 adjacent to the second end of the stud hole (i.e., the second end 73 or 75 of the contact pedestal 72); forming, in the capacitor container opening 82 or 92, a first capacitor layer 86 electrically connected with the contact pedestal 72; and forming a second capacitor layer 85 adjacent to the first capacitor layer 86; and forming a third capacitor layer 84 spaced from the first capacitor layer 86 by the second capacitor layer 85.

Another further aspect of the step of forming the capacitor structure 77 includes the steps of: forming an insulating layer 81 outside the contact pedestal 72; forming a capacitor container opening 82 or 92 through the insulating layer 81; forming, in the capacitor container opening 82 or 92, a first capacitor layer 86 electrically connected with the contact pedestal 72; forming a second capacitor layer 85 adjacent to the first capacitor layer 86; and forming a third capacitor layer 84 spaced from the first capacitor layer 86 by the second capacitor layer 85.

Figure 10:
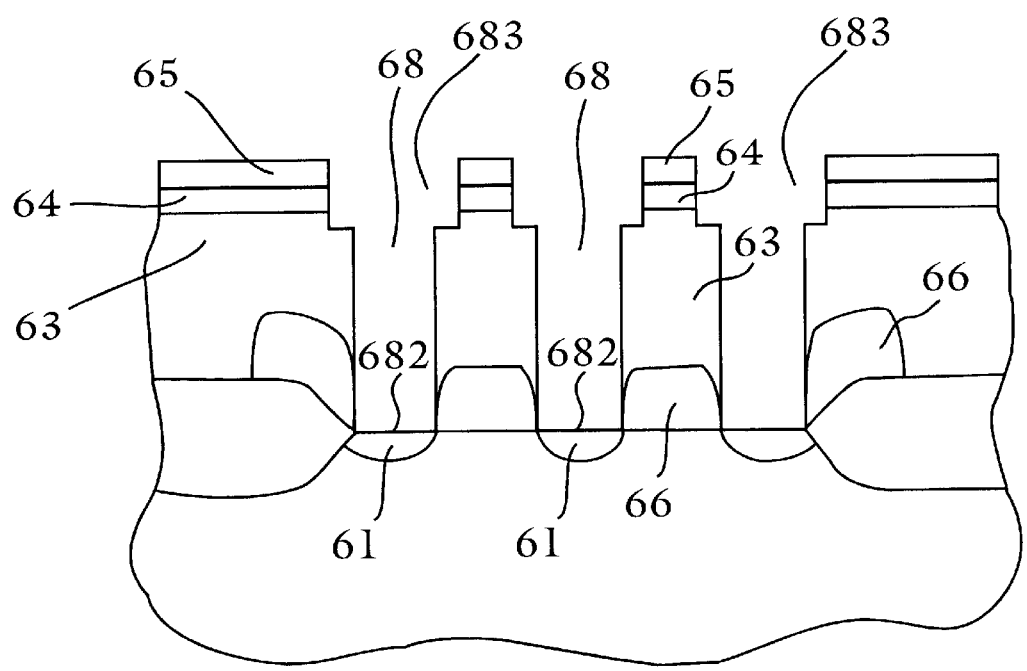

Another alternative of forming the contact pedestal 72 in FIG. 13 based on the stud hole 68 in FIG. 10 may include the steps of: depositing electrically conductive material to fill the stud hole 68 in FIG. 10, with the electrically conductive material possibly covering at least part of the mask layer 65; and removing the mask layer 65 and the electrically conductive material which is outside the stud hole (now becoming a contact pedestal).

The first end 682 of the stud hole 68 may contact the node location 61, as can be seen in FIG. 10. It can be understood that the depth 102 (in FIG. 13) of the second end 73 or 74 or 75 of the contact pedestal 72 (or the second end 683 of stud hole 68 in FIG. 10) may depend on the specified dimension, i.e., the depth 102 (in FIG. 13) of the second end 73 or 74 or 75 of contact pedestal 72 in FIG. 13 depends on the thickness 101 (in FIG. 9) of the dielectric material 60 left over the node location 61 after the step of etching the dielectric material 60 toward the node location 61 through the first opening 67. Obviously the depth 102 (in FIG. 13) of the second end 73 or 74 or 75 of contact pedestal 72 in FIG. 13 may approximately equal the thickness 101 (in FIG. 9) of the dielectric material 60 left over the node location 61 after the step of etching the dielectric material 60 toward the node location 61 through the first opening 67. The dielectric material 60 is usually a certain type of insulating material. The second end 74 of contact pedestal 72 in FIG. 14 may electrically connect a bit line 76.

While the invention has been described in terms of what are presently considered to be the most preferred embodiments, it shall not be limited to the disclosure. On the contrary, it shall be construed to cover, various modifications and similar arrangements as well as any schemes based on the spirit and scope of the invention.

What is claimed is:

1. A method of forming an electrical connection between a stack capacitor and a node location of a substrate, comprising the steps of:

forming dielectric material over said node location;

depositing a mask layer over said dielectric material;

patterning said mask layer to obtain a first opening thereof;

etching said dielectric material toward said node location through said first opening until the thickness of said dielectric material left over said node location is in a specified range;

expanding said first opening for forming a second opening thereof which is wider than said first opening;

etching said dielectric material through said second opening to expose said node location, thereby forming a stud hole with a first end thereof at said node location, and with a second end thereof having a widest cross section relative to all the other parts of said stud hole;

removing said mask layer;

filling said stud hole with electrically conductive material to form a contact pedestal; and forming a stack capacitor structure which is at the second end of said stud hole and is electrically connected to said node location through said contact pedestal.

2. The method according to claim 1 wherein the step of filling said stud hole with electrically conductive material includes the steps of:

depositing said electrically conductive material to fill said stud hole;

and removing said electrically conductive material which is outside said stud hole.

3. The method according to claim 1 wherein the step of expanding said first opening for forming a second opening includes a step of patterning said mask layer.

4. The method according to claim 1 wherein said dielectric material includes an insulating layer and a dielectric layer, said insulating layer being between said node location and said dielectric layer.

5. The method according to claim 1 wherein said first opening is at a location corresponding to said node location.

6. The method according to claim 1 wherein said first opening is above said node location.

7. The method according to claim 1 wherein the step of etching said dielectric material is a directional etching.

8. The method according to claim 1 wherein said specified range includes only thickness dimensions which are larger than zero.

9. The method according to claim 1 wherein the second end of said stud hole has a depth depending on the thickness of said dielectric material left over said node location after the step of etching said dielectric material toward said node location through said first opening.

10. The method according to claim 1 wherein said first opening is expanded laterally to form said second opening.

11. The method according to claim 1 wherein said second opening is formed by removing part of said mask layer around said first opening.

12. The method according to claim 1 wherein the step of forming said capacitor structure includes the steps of:

forming a first capacitor layer electrically connected with said contact pedestal; and forming a second capacitor layer adjacent to said first capacitor layer, and a third capacitor layer adjacent to said second capacitor layer.

13. The method according to claim 1 wherein the step of forming said capacitor structure includes the steps of:

forming a first capacitor layer electrically connected with said contact pedestal; and forming a second capacitor layer adjacent to said first capacitor layer;

and forming a third capacitor layer spaced from said first capacitor layer by said second capacitor layer.

14. The method according to claim 1 wherein the step of forming said capacitor structure includes the steps of:

forming a capacitor container opening adjacent to the second end of said stud hole;

forming, in said capacitor container opening, a first capacitor layer electrically connected with said contact pedestal; and forming a second capacitor layer adjacent to said first capacitor layer;

and forming a third capacitor layer spaced from said first capacitor layer by said second capacitor layer.

15. The method according to claim 1 wherein the step of forming said capacitor structure includes the steps of:

forming a capacitor container opening over the second end of said contact pedestal;

forming, in said capacitor container opening, a first capacitor layer electrically connected with said contact pedestal; and forming a second capacitor layer adjacent to said first capacitor layer;

and forming a third capacitor layer adjacent to said second capacitor layer.

16. The method according to claim 1 wherein the step of forming said capacitor structure includes the steps of:

forming an insulating layer outside said contact pedestal;

forming a capacitor container opening through said insulating layer;

forming, in said capacitor container opening, a first capacitor layer electrically connected with said contact pedestal;

forming a second capacitor layer adjacent to said first capacitor layer;

and forming a third capacitor layer spaced from said first capacitor layer by said second capacitor layer.

17. A method of forming an electrical connection between a stack capacitor and a node location of a substrate, comprising the steps of:

forming dielectric material over said node location;

depositing a mask layer over said dielectric material;

patterning said mask layer to obtain a first opening thereof;

etching said dielectric material toward said node location through said first opening until the thickness of said dielectric material left over said node location is in a specified range;

expanding said first opening to form a second opening thereof which is wider than said first opening;

etching said dielectric material through said second opening to expose said node location, thereby forming a stud hole with a first end thereof at said node location, and with a second end thereof having a widest cross section relative to all the other parts of said stud hole;

depositing electrically conductive material to fill said stud hole for forming a contact pedestal;

removing said mask layer and said electrically conductive material which is outside said contact pedestal; and forming a stack capacitor structure adjacent to the second end of said stud hole and is electrically connected to said node location through said contact pedestal.

18. A method of forming an electrical connection between a stack capacitor and a node location of a substrate, comprising the steps of:

forming dielectric material over said node location;

depositing a mask layer over said dielectric material;

patterning said mask layer to obtain a first opening thereof;

etching said dielectric material toward said node location through said first opening until the thickness of said dielectric material left over said node location is approximately equal to a specified dimension;

patterning said mask layer to expand said first opening for forming a second opening thereof which is wider than said first opening;

etching said dielectric material through said second opening to expose said node location, thereby forming a stud hole with a first end thereof contacting said node location, and with a second end thereof having a depth approximately equal to said specified dimension, and having a widest cross section relative to all the other parts of said stud hole;

depositing electrically conductive material to fill said stud hole for forming a contact pedestal;

removing said mask layer and said electrically conductive material which is outside said contact pedestal; and forming a stack capacitor structure adjacent to the second end of said contact pedestal and is electrically connected to said node location through said contact pedestal.

19. The method according to claim 18 wherein said dielectric material is insulating material.

20. The method according to claim 18 wherein said dielectric material includes an insulating layer over said node location, and a dielectric layer over said insulating layer.

* * * * *